United States Patent
Won et al.

(10) Patent No.: US 7,898,011 B2
(45) Date of Patent: Mar. 1, 2011

(54) IMAGE SENSOR HAVING ANTI-REFLECTION FILM FOR REDUCING CROSSTALK

(75) Inventors: Jun Ho Won, Seoul (KR); Se Jung Oh, Seoul (KR); Jae Young Rim, Seoul (KR); Byoung Su Lee, Yeosu-si (KR)

(73) Assignee: Siliconfile Technologies Inc., Seoul (KR)

( * ) Notice: Subject to any disclaimer, the term of this patent is extended or adjusted under 35 U.S.C. 154(b) by 174 days.

(21) Appl. No.: 12/160,366

(22) PCT Filed: Dec. 7, 2006

(86) PCT No.: PCT/KR2006/005266
§ 371 (c)(1),
(2), (4) Date: Jul. 9, 2008

(87) PCT Pub. No.: WO2007/086649
PCT Pub. Date: Aug. 2, 2007

(65) Prior Publication Data
US 2009/0008737 A1      Jan. 8, 2009

(30) Foreign Application Priority Data
Jan. 25, 2006     (KR) ............... 10-2006-0007579

(51) Int. Cl.
*H01L 31/062* (2006.01)
(52) U.S. Cl. ............ 257/294; 257/291; 257/292; 257/432; 257/E21.002
(58) Field of Classification Search ......... 257/291–294, 257/432; 438/69–70, 59–65, 73
See application file for complete search history.

(56) References Cited

U.S. PATENT DOCUMENTS

| | | | |
|---|---|---|---|
| 2002/0027228 A1* | 3/2002 | Lee | 257/69 |
| 2004/0016935 A1 | 1/2004 | Kubota et al. | |
| 2006/0154433 A1* | 7/2006 | Onoda | 438/393 |
| 2007/0052035 A1* | 3/2007 | Nagaraja et al. | 257/369 |

FOREIGN PATENT DOCUMENTS

| | | |
|---|---|---|
| EP | 1566842 | 8/2005 |
| JP | 2002-198505 | 7/2002 |
| JP | 2005-005540 | 1/2005 |

OTHER PUBLICATIONS

International Search Report for corresponding International Application No. PCT/KR2006/005266 dated Apr. 11, 2007.
Written Opinion of the Ineternational Searching Authority for corresponding International Application No. PCT/KR2006/005266 dated Apr. 11, 2007.

* cited by examiner

*Primary Examiner* — Dung A. Le
(74) *Attorney, Agent, or Firm* — Kile Park Goekjian Reed & McManus PLLC

(57) ABSTRACT

An image sensor for reducing crosstalk includes anti-reflection films which are formed between a plurality of metal wire lines of the lowest metal wiring layer and a semiconductor substrate and between one of the metal wiring layers and another metal wiring layer. The image sensor having the anti-reflection films according to the present invention can reduce color crosstalk and noises in comparison with a conventional image sensor by using the anti-reflection films formed above the surroundings of the photodiodes.

4 Claims, 2 Drawing Sheets

IMAGE SENSOR HAVING ANTI-REFLECTION FILM FOR REDUCING CROSSTALK

BACKGROUND OF THE INVENTION

1. Field of the Invention

The present invention relates to an image sensor, and more particularly, to an image sensor with an anti-reflection film for preventing color crosstalk and a smear phenomenon and a method of manufacturing the same.

2. Description of the Related Art

An image sensor is a device which converts optical energy transmitted through each of red, green, and blue color filters into an electrical signal by using a photo diode and outputs the converted electrical signal by using a metal oxide semiconductor (MOS) transistor.

FIG. 1 shows a conventional image sensor.

Light transmitted through a micro lens 160 and each of red, green, and blue color filters 170, 171, and 172 reflects from a silicon surface and has a path ① or ② so as to reflect again from an adjacent photodiode 120, so that the light and a light having a path ③ generate crosstalk. In addition, light having a path ④ is mixed with an electrical signal of a photo diode, so that noises may occur.

Namely, the conventional image sensor has a problem in that light transmitted through a color filter may not be incident perpendicularly on a photodiode disposed below the color filter and may reflect from a metal wire line and be incident on an adjacent photodiode with light transmitted through an adjacent color filter.

In addition, light reflecting from the silicon surface may reflect again from the metal wire line disposed above the silicon surface and be incident on an adjacent photodiode, so that color crosstalk may be generated. In addition, the light may be incident on a transmitting pathway of an adjacent MOS transistor for transmitting a carrier generated from the photodiode and may generate an added carrier, so that the added carrier may be mixed with an electrical signal of a photodiode and cause noises.

In order to solve the aforementioned problem, a reflection film is formed in an interlayer insulating layer such that light reflecting from a silicon surface of a photodiode reflects from an upper reflection film and is incident on the photodiode in order to improve a light sensitivity.

FIG. 2 shows a conventional image sensor having a reflection film.

A reflection film 150 is formed between a photodiode 120 and a metal wiring layer. Therefore, light having the path ① transmitted through the micro lens 160 and the color filter 170, 171, or 172 reflects from a silicon surface and reflects again from the reflection film 150 so as to be incident on the photodiode, so that light efficiency increases.

However, light having the path ② reflecting from the silicon surface may not reflect from the reflection film 150 and reflect from a metal wire line 140 so as to be incident on an adjacent photodiode 120, so that the light and light having the path ③ may generate crosstalk. In addition, light having the path ④ may be mixed with an electrical signal of a photodiode, so that noises may occur.

In addition, since the reflection film 150 covers a portion of the photodiode 120, an effective region of the photodiode 120 is reduced. Therefore, when light is not in focus like light having a path ⑤, sensitivity may decrease

SUMMARY OF THE INVENTION

In order to solve the aforementioned problem, the present invention provides an image sensor having an anti-reflection film and a method of manufacturing the same capable of preventing light transmitted through a color filter from being incident on an adjacent photodiode and preventing light which is transmitted through a color filter and is normally incident on a corresponding photodiode but reflects from a silicon substrate and re-reflects from an upper metal layer from being incident on an adjacent photodiode so as not to generate an interference, so that it is possible to reduce color crosstalk and noises.

According to an aspect of the present invention, there is provided an image sensor including: a plurality of photodiodes formed in a semiconductor substrate at a predetermined interval; an interlayer insulating layer formed on the semiconductor substrate to cover the semiconductor substrate; an at least two anti-reflection film formed above the surrounding of the photodiode and in the interlayer insulating layer; and a plurality of metal wiring layers which are formed with a predetermined pattern in the interlayer insulating layer and include a plurality of metal wire lines.

According to another aspect of the present invention, there is provided a method of manufacturing an image sensor having an anti-reflection film including steps of: (a) forming a plurality of photodiodes in a semiconductor substrate at a predetermined interval; (b) forming an interlayer insulating layer to cover the semiconductor substrate in which a plurality of the photodiodes are formed; (c) forming the anti-reflection film above the surrounding of the formed photodiode and in the interlayer insulating layer; and (d) forming a plurality of metal wiring layers including a plurality of metal wire lines with a predetermined pattern in the formed interlayer insulating layer.

DESCRIPTION OF REFERENCE NUMERALS INDICATING PRIMARY ELEMENTS IN THE DRAWINGS

Figure 1:
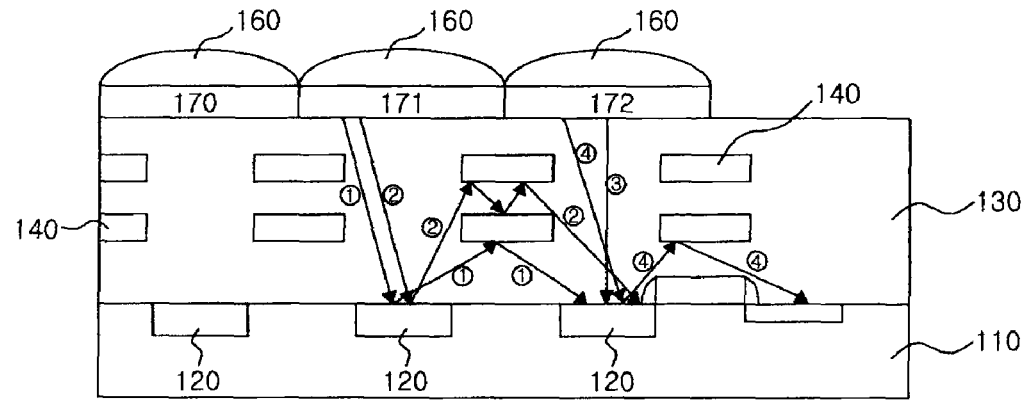
FIG. 1 is a cross-sectional view showing a conventional image sensor.
Figure 2:
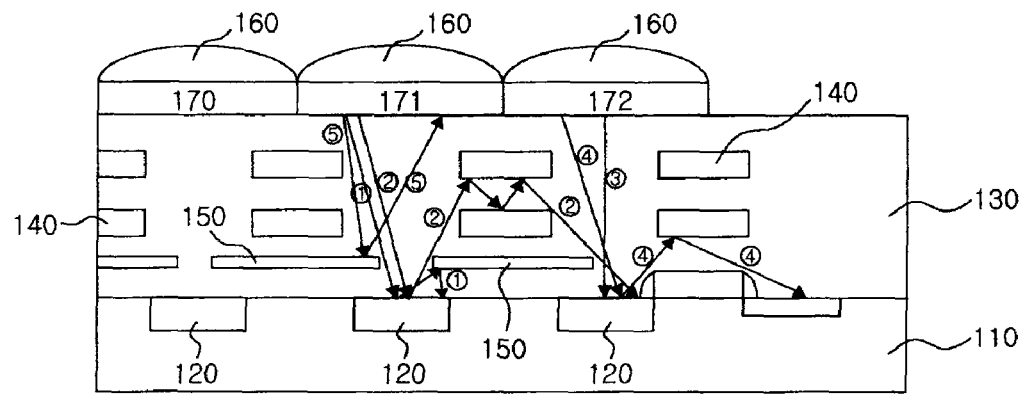
FIG. 2 is a cross-sectional view showing a conventional image sensor having a reflection film.

110, 210: semiconductor substrate
120,220: photodiode region
130, 230: interlayer insulating layer
140, 240: metal wire line
150: reflection film
160, 260: micro lens
170, 270: green color filter region
171, 271: red color filter region
172, 272: blue color filter region
250: anti-reflection film

DETAILED DESCRIPTION OF THE INVENTION

Hereinafter, exemplary embodiments of the present invention will be described in detail with reference to the attached drawings.

Figure 3:
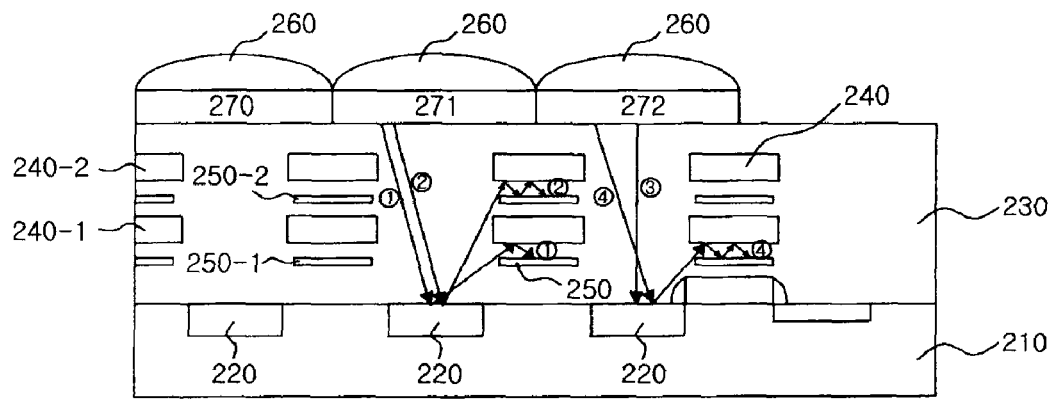
FIG. 3 is a cross-sectional view showing an image sensor having a anti-reflection film according to the present invention.

FIG. 3 shows an image sensor having an anti-reflection film according to an embodiment of the present invention. The image sensor includes a semiconductor substrate 210, a plurality of photodiodes 220, an interlayer insulating layer 230, at least two metal wiring layers 240-1, 240-2, and at least two anti-reflection films 250-1, 250-2.

A plurality of the photodiodes 220 is formed in the semiconductor substrate 210 at a predetermined interval down to a predetermined depth. The interlayer insulating layer 230 is formed on the semiconductor substrate 210 so as to cover the semiconductor substrate 210 in which a plurality of the photodiodes 220 are formed. At least one of the metal wiring layers 240-1, 240-2 includes a plurality of metal wire lines and is formed in the interlayer insulating layer 230 with a predetermined pattern.

The first anti-reflection film 250-1 is formed between the lowest metal wiring layer 240-1 and the semiconductor substrate 210. The second anti-reflection film 250-2 is form between the lowest metal wiring layer 240-1 and the second metal wiring layer 240-2 located above the lowest metal wiring layer 240-1. The anti-reflection films 250-1, 250-2 include at least one of poly silicon, amorphous silicon, tungsten (W), and TiN.

In addition, in terms of a size, a conventional reflection film is larger than the metal wire line. On the contrary, the anti-reflection films 250-1, 250-2 according to the present invention are smaller than the metal wire line.

Light path is described with reference to FIG. 3.

Even though light transmitted through a micro lens 260 and a red, green, or blue color filter 270, 271, or 272 having a path ① or ② reflects from the silicon surface and re-reflects from the metal wire lines of the metal wiring layers 240-1, 240-2, an intensity of the light is lessened by the anti-reflection films 250-1, 250-2 having high absorbance. Therefore, the light cannot be incident on an adjacent photodiode 220.

In addition, although the light is incident on the photodiode 220, the light has a small amount of optical energy, so that the crosstalk caused from the incident light and light having a path ③ can be removed. In addition, light having a path ④ is prevented from being incident into a transmission path of the MOS transistor. Therefore, an improved image quality can be obtained in comparison with a structure of the conventional image sensor.

Figure 4:
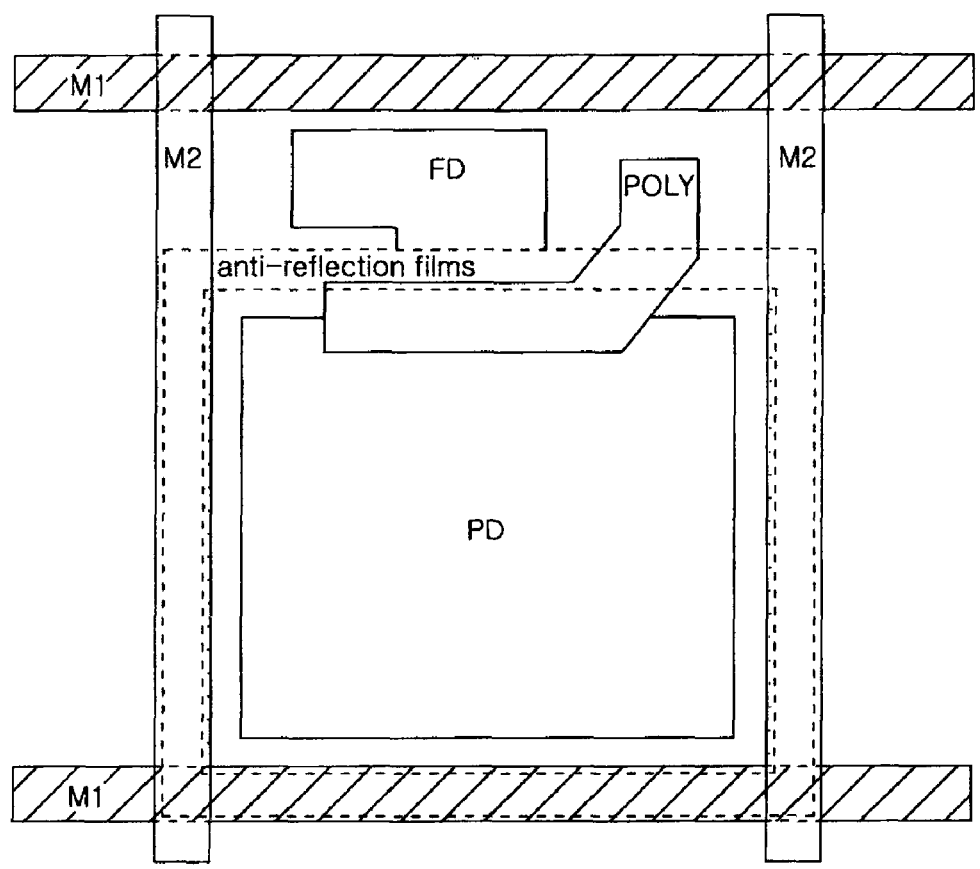
FIG. 4 is a top plan view showing a structure of an anti-reflection film of an image sensor having the anti-reflection film according to the present invention.

FIG. 4 is a top plan view showing an image sensor having an anti-reflection film according to an embodiment of the present invention. The anti-reflection film is formed between a first metal wiring layer M1 and a second metal wiring layer M2 to surround a photodiode PD.

A method of manufacturing an image sensor having an anti-reflection film according to the present invention will be described.

Polysilicon gates and the photodiodes 220 are formed on the semiconductor substrate 210, and the interlayer insulating layer 230 is deposited thereon.

Before the metal wiring layer 240 is formed, a material having high absorbance serving as the anti-reflection film 250 is formed in the interlayer insulating layer 230. The anti-reflection film 250 may surround the photodiode 220 as shown in FIG. 3. The anti-reflection film 250 may be made of a material of polysilicon, amorphous silicon, tungsten (W), TiN, or the like.

Next, the metal wiring layer 240, the color filters 270, 271, and 272, and the micro lenses 260 are formed, so that the image sensor capable of solving the color crosstalk problem can be manufactured. [271,272,273→270,271,272]

While the present invention has been particularly shown and described with reference to exemplary embodiments thereof, it will be understood by those skilled in the art that various changes in form and details may be made therein without departing from the spirit and scope of the present invention as defined by the appended claims.

An image sensor having an anti-reflection film according to the present invention can reduce color crosstalk and noises in comparison with a conventional image sensor by using the anti-reflection film formed above the surrounding of a photodiode.

What is claimed is:

1. An image sensor comprising:
a plurality of photodiodes formed in a semiconductor substrate;
an interlayer insulating layer formed on the semiconductor substrate to cover the semiconductor substrate;
at least two metal wiring layers formed in the interlayer insulating layer, the at least two metal wiring layers including a plurality of metal wire lines, and
at least two anti-reflection films disposed between the at least two metal wiring layers and the semiconductor substrate, wherein the at least two anti-reflection films are respectively disposed between a lowest metal wiring layer of the at least two metal wiring layers and the semiconductor substrate, and between the lowest metal wiring layer and another metal wiring layer formed right above the lowest metal wiring layer; wherein each of the at least two anti-reflection films is configured to be separate from the metal wiring layer.

2. The image sensor according to claim 1, wherein a size of the anti-reflection films is smaller than a size of the metal wire lines to allow reflecting light to be incident onto the photodiodes.

3. The image sensor according to claim 1, wherein each of the anti-reflection films is configured to be separate from the semiconductor substrate.

4. The image sensor according to claim 2, wherein the size of each of the anti-reflection films is a width of each of the anti-reflection films, and the size of the metal wire lines is a width of each of the metal wire lines.

* * * * *